US008099705B2

(12) United States Patent
Dickinson et al.

(10) Patent No.: US 8,099,705 B2
(45) Date of Patent: Jan. 17, 2012

(54) TECHNIQUE FOR DETERMINING CIRCUIT INTERDEPENDENCIES

(75) Inventors: Paul J. Dickinson, San Jose, CA (US); Venkatesh P. Gopinath, Fremont, CA (US); Karl P. Dahlgren, Fremont, CA (US); Liang-Chi Chen, Cupertino, CA (US)

(73) Assignee: Oracle America, Inc., Redwood Shores, CA (US)

( * ) Notice: Subject to any disclaimer, the term of this patent is extended or adjusted under 35 U.S.C. 154(b) by 296 days.

(21) Appl. No.: 12/432,002

(22) Filed: Apr. 29, 2009

(65) Prior Publication Data

US 2010/0281442 A1   Nov. 4, 2010

(51) Int. Cl.
*G06F 17/50* (2006.01)
(52) U.S. Cl. .................................. 716/136; 716/100
(58) Field of Classification Search .............. 716/100, 716/136
See application file for complete search history.

(56) References Cited

U.S. PATENT DOCUMENTS

| | | | |
|---|---|---|---|
| 5,633,813 A * | 5/1997 | Srinivasan | 703/14 |
| 2003/0204354 A1 * | 10/2003 | Corr | 702/117 |
| 2004/0162693 A1 * | 8/2004 | Corr | 702/117 |

* cited by examiner

*Primary Examiner* — Suchin Parihar
(74) *Attorney, Agent, or Firm* — Park, Vaughan, Fleming & Dowler LLP; Steven E Stupp (57) ABSTRACT

Embodiments of a device (such as a computer system or a circuit tester), a method, and a computer-program product (i.e., software) for use with the device are described. These systems and processes may be used to statistically characterize interdependencies between sub-circuits in an integrated circuit (which are referred to as 'aggressor-victim relationships'). In particular, statistical relationships between the aggressors and victims are determined from values of a performance metric (such as clock speed) when the integrated circuit fails for a group of state-change difference vectors. Using these statistical relationships, a worst-case sub-group of the state-change difference vectors, such as the worst-case sub-group, is selected. This sub-group can be used to accurately test the integrated circuit.

20 Claims, 4 Drawing Sheets

TECHNIQUE FOR DETERMINING CIRCUIT INTERDEPENDENCIES

BACKGROUND

1. Field of the Invention

The present invention generally relates to techniques for testing circuits. More specifically, the present invention relates to techniques for selecting worst-case state-change difference vectors based on interdependencies in digital circuits for circuit-testing purposes.

2. Related Art

Signal integrity or cross-talk is an increasingly important problem in integrated-circuit design and reliability testing. In very large integrated circuits, such as microprocessors, there are often as many as several hundred million interconnects. Cross-talk signals between these interconnects can significantly degrade performance and limit the operating bandwidth (or clock frequency). Unfortunately, it is very difficult and time-consuming to accurately model cross-talk using existing integrated-circuit design and simulation tools. These problems can limit potential remedial action, and increases the cost and risk associated with designing and manufacturing integrated circuits.

Hence, what is needed are techniques for characterizing and testing integrated circuits without the problems described above.

SUMMARY

One embodiment of the present invention provides a device (such as a computer system or a circuit tester) that selects a sub-group of state-change difference vectors from a group of state-change difference vectors to be used while testing a circuit. During operation, the device generates the group state-change difference vectors. For example, the group state-change difference vectors may be generated using a pseudo-random generator. Note that a given state-change difference vector corresponds to a change in a state of circuit components in the circuit (such as logic circuits and/or gates), and that one or more elements in the given state-change difference vector specify state transitions for one or more of the circuit components. Moreover, the number of state-change difference vectors in the group of state-change difference vectors may be based on the number of logic levels and fan-in between gates in the circuit.

Then, the device determines values of a performance metric (such as clock speed and/or power consumption) for the group of state-change difference vectors when the circuit fails during testing, where a given value of the performance metric corresponds to the given state-change difference vector. For example, the values of the performance metric may be determined by performing measurements on a current version of the circuit. Additionally, failure of the circuit for the given state-change difference vector may be associated with cross-talk.

Furthermore, for a given sub-circuit in a set of sub-circuits in the circuit and the group of state-change difference vectors, the device calculates statistical relationships between a transition type in the given sub-circuit when the circuit failed during testing and transition types in other sub-circuits in the set of sub-circuits, where a statistical relationship is determined for each pairing of the given sub-circuit with one of the other sub-circuits. This calculation may be repeated for all of the sub-circuits in the set of sub-circuits. In some embodiments, the device selects the set of sub-circuits in the circuit prior to calculating the statistical relationships.

Note that transition types in the other sub-circuits, which may be the same as or different than the transition type, may include: a transition from a first logical state to a second logical state, a transition from the second logical state to the first logical state, and no transition. Moreover, the statistical relationship for each pairing may correspond to co-occurrences and/or cross-occurrences of the transition type in the given sub-circuit and one of the transition types in the one of the other sub-circuits for multiple state-change difference vectors in the group of state-change difference vectors. A co-occurrence for a given state-change difference vector includes a presence of the transition type in the given sub-circuit and a presence of the one of the transition types in the one of the other sub-circuits, or an absence of the transition type in the given sub-circuit and an absence of the one of the transition types in the one of the other sub-circuits. Similarly, a cross-occurrence for a given state-change difference vector includes a presence of the transition type in the given sub-circuit and an absence of the one of the transition types in the one of the other sub-circuits, or an absence of the transition type in the given sub-circuit and a presence of the one of the transition types in the one of the other sub-circuits.

Next, the device selects the sub-group of state-change difference vectors based on the calculated statistical relationships, where the selected state-change difference vectors are those that result in failure of the circuit during testing for a range of values of the performance metric.

In some embodiments, the device determines a margin for the performance metric using the selected sub-group of state-change difference vectors. Based on the determined margin, the circuit may be revised and/or manufacturing of the circuit may be changed.

Another embodiment provides a method including at least some of the above-described operations.

Another embodiment provides a computer-program product that facilitates the above-described operations on the device.

BRIEF DESCRIPTION OF THE FIGURES

Table 1 provides measured clock frequencies at failure for multiple state-change difference vectors and sub-circuits in an integrated circuit in accordance with an embodiment of the present invention.

Table 2 provides regression analysis results based on the measurements in Table 1 in accordance with an embodiment of the present invention.

Note that like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a device (such as a computer system or a circuit tester), a method, and a computer-program product (i.e., software) for use with the device are described. These systems and processes may be used to statistically characterize interdependencies between sub-circuits in an integrated circuit (which are referred to as 'aggressor-victim relationships'). In particular, statistical relationships between the aggressors and victims are determined from values of a performance metric (such as clock speed) when the integrated circuit fails for a group of state-change difference vectors. Using these statistical relationships, a sub-group of the state-change difference vectors, such as the worst-case sub-group, is selected. This sub-group can be used to accurately test the integrated circuit.

This testing technique allows the interdependencies (or coupling relationships) to be identified without using detailed circuit analysis. For example, the dominant aggressor sub-circuits for a given victim sub-circuit (or net) can be determined in an integrated circuit without using detailed knowledge about physical adjacencies of the sub-circuits. Consequently, this technique may avoid the limitations of existing integrated-circuit design and simulation tools, which may allow significant coupling relationships (which might have otherwise been overlooked) to be identified.

Moreover, by identifying the sub-group of the state-change difference vectors, this testing technique can be used to improve: integrated-circuit design, integrated-circuit manufacturing yields, integrated-circuit performance and/or integrated-circuit reliability. Therefore, this testing technique may reduce the cost and time needed to develop and manufacture integrated circuits.

Figure 1:
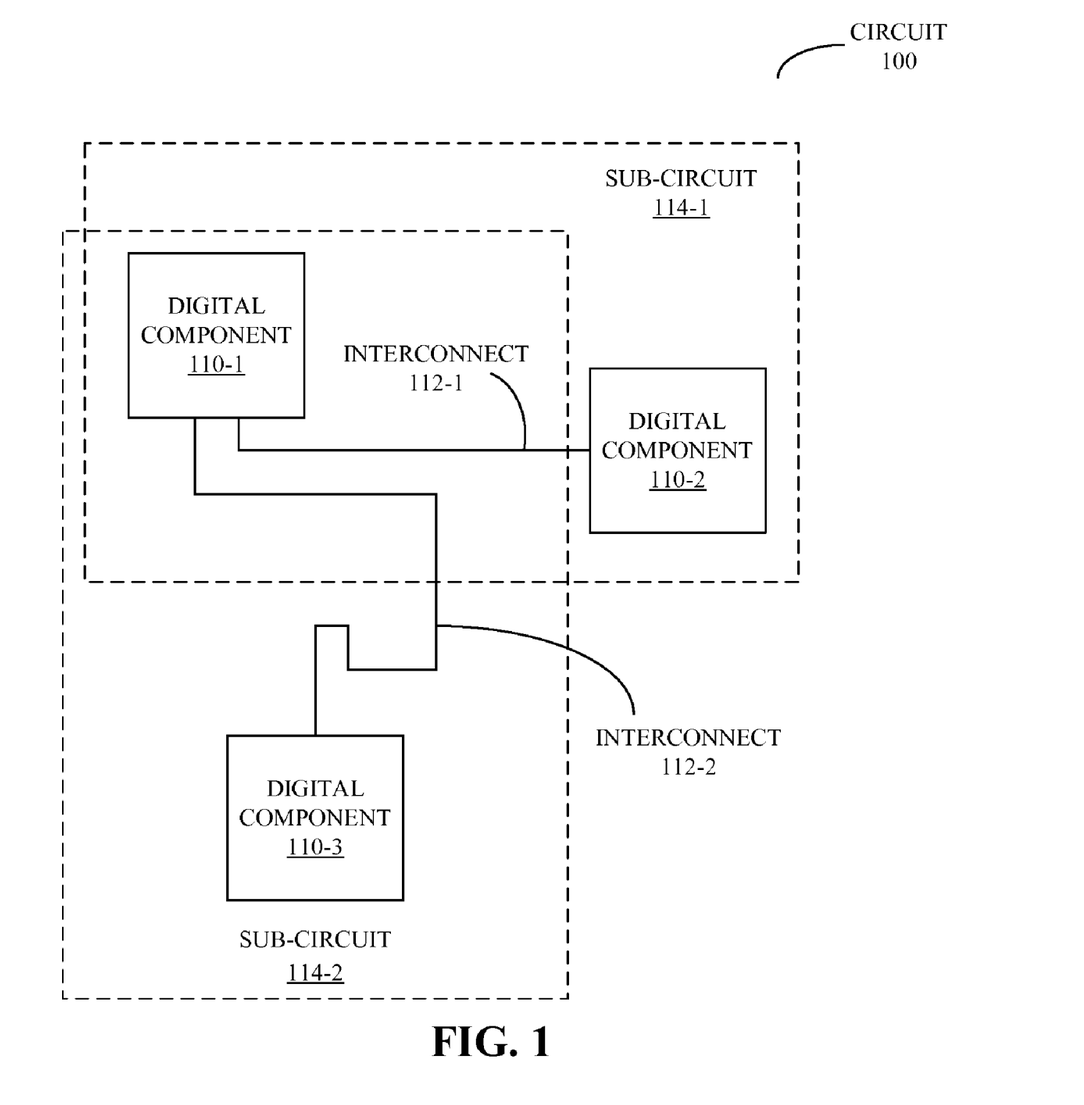
FIG. 1 is a block diagram illustrating a circuit in accordance with an embodiment of the present invention.

We now describe embodiments of a technique for selecting a sub-group of state-change difference vectors for use in circuit testing. FIG. 1 presents a block diagram illustrating a circuit 100 disposed on an integrated circuit. This circuit may include digital components 110 (or more generally, circuit components), such as state elements (logic circuits that can include multiple gates), as well Boolean gates between state elements). These digital components are coupled by interconnects 112. Note that a particular combination of logical values or states (such as logical '0's and logical '1's) for at least some of these digital components 110 (such as the state elements) can be expressed as a state vector, where each element in the state vector corresponds to the logical state of a corresponding digital component, such as digital component 110-1. (In general, there may be multiple state elements in digital components 110. Consequently, the state of a given digital component may be a vector.) Moreover, different permutations and combinations of logical states for the digital components 110 can be collected in a group of state vectors.

In an alternate and equivalent representation, the state vectors may be expressed as so-called state-change difference vectors. Note that a given state-change difference vector corresponds to a change in a state of digital components 110, and that one or more elements in the given state-change difference vector specify state changes (which are referred to as transitions) to one or more of the digital components 110. For example, the transitions may include: a transition from a first logical state to a second logical state (such as a logical '0' to a logical '1'), a transition from the second logical state to the first logical state, and no transition.

In the discussion that follows, a group of state-change difference vectors is used in an illustrative embodiment of the testing technique. In this example, the group of state-change difference vectors is used as test sequences for circuit 100. In particular, while varying one or more circuit parameters or performance metrics (such as the clock frequency), cross-talk between sub-circuits 114 in circuit 100 is measured. For each of the state-change difference vectors, values of the one or more performance metrics when circuit 100 fails are used to identify the sub-group of the state-change difference vectors.

Figure 2:
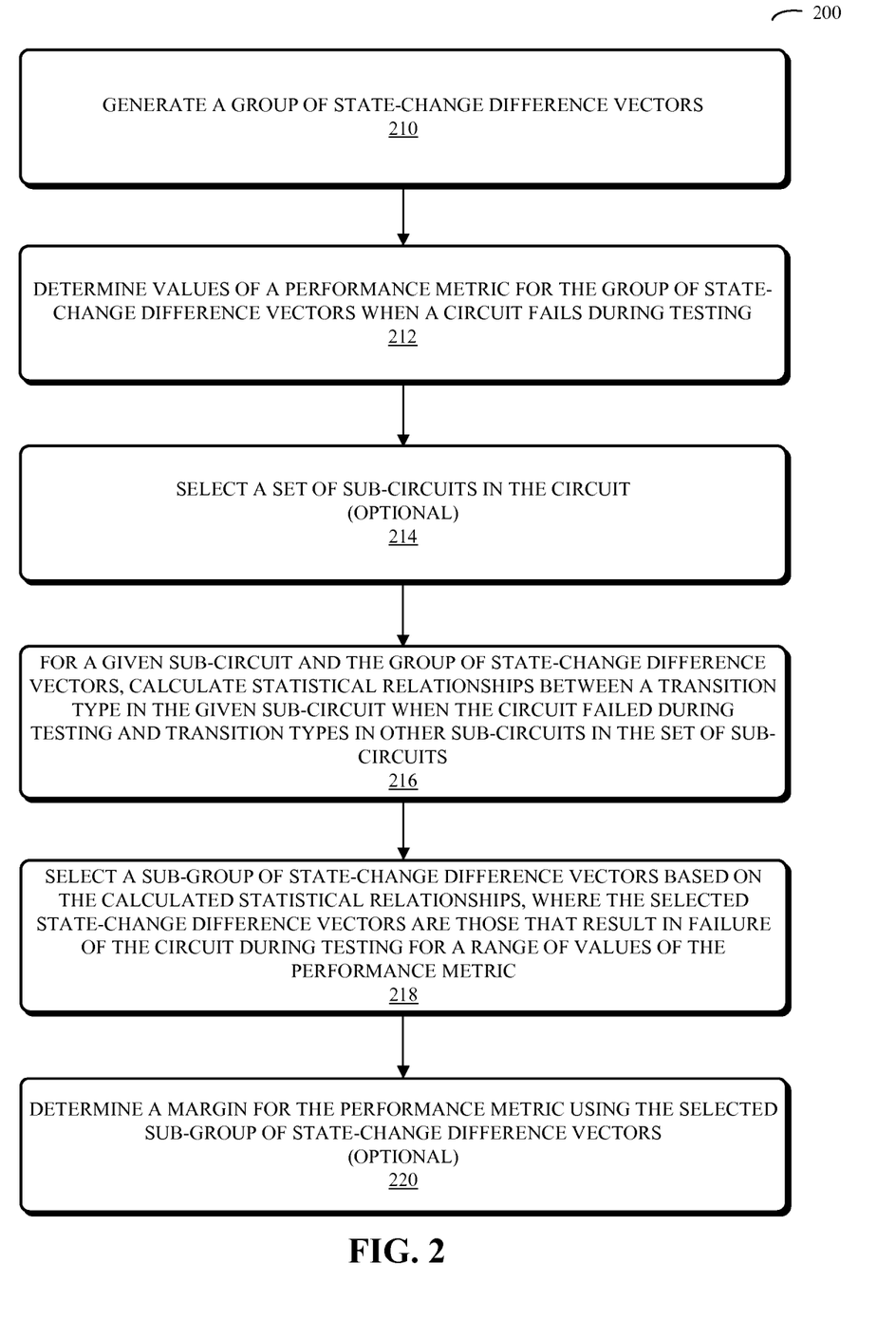
FIG. 2 is a flow chart illustrating a process for selecting a sub-group of state-change difference vectors from a group of state-change difference vectors for testing a circuit in accordance with an embodiment of the present invention.

FIG. 2 presents a flow chart illustrating a process 200 for selecting the sub-group of state-change difference vectors from the group of state-change difference vectors for testing a circuit (such as circuit 100 in FIG. 1), which may be performed by a device (such as a computer system or a circuit tester). During operation, the device generates the group state-change difference vectors (210). For example, the group state-change difference vectors may be generated using a pseudo-random generator. Note that a number of state-change difference vectors in the group of state-change difference vectors may be based on a number of logic levels and fan-in between gates in the circuit.

Then, the device determines values of a performance metric (such as clock speed and/or power consumption) for the group of state-change difference vectors when the circuit fails during testing (212), where a given value of the performance metric corresponds to the given state-change difference vector. For example, the values of the performance metric may be determined by performing measurements on a current version of the circuit.

Furthermore, for a given sub-circuit in a set of sub-circuits in the circuit and the group of state-change difference vectors, the device calculates statistical relationships between a transition type in the given sub-circuit when the circuit failed during testing and transition types in other sub-circuits in the set of sub-circuits (216), where a statistical relationship is determined for each pairing of the given sub-circuit with one of the other sub-circuits. This calculation may be repeated for all of the sub-circuits in the set of sub-circuits. In some embodiments, the device optionally selects the set of sub-circuits in the circuit (214) prior to calculating the statistical relationships (216).

Note that transition types in the other sub-circuits may be the same as or different than the transition type. Moreover, the statistical relationship for each pairing may correspond to co-occurrences and/or cross-occurrences of the transition type in the given sub-circuit and one of the transition types in the one of the other sub-circuits for multiple state-change difference vectors in the group of state-change difference vectors. A co-occurrence for a given state-change difference vector includes a presence of the transition type in the given sub-circuit and a presence of the one of the transition types in the one of the other sub-circuits, or an absence of the transition type in the given sub-circuit and an absence of the one of the transition types in the one of the other sub-circuits. Similarly, a cross-occurrence for a given state-change difference vector includes a presence of the transition type in the given sub-circuit and an absence of the one of the transition types in the one of the other sub-circuits, or an absence of the transition type in the given sub-circuit and a presence of the one of the transition types in the one of the other sub-circuits.

Next, the device selects the sub-group of state-change difference vectors based on the calculated statistical relationships (218), where the selected state-change difference vectors are those that result in failure of the circuit during testing for a range of values of the performance metric.

In some embodiments, the device optionally determines a margin for the performance metric using the selected sub-group of state-change difference vectors (220). Based on the determined margin, the circuit may be revised and/or manufacturing of the circuit may be changed.

Note that in some embodiments of process 200 there may be additional or fewer operations. Moreover, the order of the operations may be changed and/or two or more operations may be combined into a single operation. Additionally, the preceding operations may be implemented using hardware and/or software, as is known in the art.

In an exemplary embodiment, a group of test patterns, such as the group of state-change difference vectors, is generated. In order to obtain meaningful results, a sufficient number of test patterns which are uncorrelated with each other (such as pseudo-random sequences) are used. In general, the number of test patterns in the group of test patterns depends on: the number of digital components 110 (FIG. 1) or, more generally, the number of state elements, the fan-in, and the number of levels/depth of logic between the digital components 110 (FIG. 1). For example, if circuit 100 (FIG. 1) includes only two coupled gates and no depth gates (i.e., intermediate gates between the two coupled gates), there may be two state-change difference vectors in the group of state-change difference vectors. Alternatively, if the depth in circuit 100 (FIG. 1) is approximately 100 and the fan-in is approximately 1000, there may be 35,000 state-change difference vectors in the group of state-change difference vectors.

Using the group of state-change difference vectors, data is collected from the integrated circuit by measuring the clock frequency at which the circuit 100 (FIG. 1) fails for each of the state-change difference vectors. Note that this testing technique may be applied to full-scan designs, so that traditional at-speed structural testing techniques can be used (e.g., a transition test or a path-delay test). Note that a 'full-scan' design includes a circuit where states of all of the state elements in the design can be defined during a test (i.e., all of the state elements are scannable). Moreover, when gates in a circuit may have possible defects in a fault model (which represents physical defects in a design layout), a structural test includes sufficient combinations of tests to stimulate every possible node in the fault model. Similarly, an 'at-speed' structural test is a structural test that is applied to the gates in a circuit at the rated speed of the design. In addition, a transition test causes a transition to occur through one or more nodes in a circuit, and a path-delay test picks paths in the circuit to test based at least in part on static timing analysis.

When calculating the statistical relationships, a rising or a falling transition type on a victim sub-circuit or net is picked (for example, the sub-circuit may be picked at random or the sub-circuit picked may be the one that fails at the lowest clock frequency). Then, all of the state-change difference vectors where this transition type occurs in the sub-circuit may be determined. Moreover, transitions in the other sub-circuits in the set of sub-circuits may be identified for the determined state-change difference vectors. These other sub-circuits may define the potential aggressor sub-circuits or nets.

A variety of techniques may be used to select the sub-circuits. For example, the complete list of all sub-circuits or nets in the design may be used. In this case, once a sub-circuit is identified as an aggressor to the victim sub-circuit, an additional check for physical adjacency may be performed. Alternatively, the number of potential aggressor sub-circuits may be based on a simple rule, such as only including sub-circuits in the set of sub-circuits that are in the same cluster or which are within a certain distance from the victim sub-circuit.

Note that in simple integrated circuits, the top-level wiring in the chip includes point-to-point interconnections. Therefore, in order to determine or identify the transition in a given sub-circuit, all that is needed are the scan_in and scan_out values for the flop driving the given sub-circuit. This extraction can be performed using only the state-change difference vectors, without further knowledge of the design. However, in the general case, where there are multiple input logic gates, a circuit simulation on a gate-level netlist may be used to determine the transitions on all of the sub-circuits.

Next, stepwise regression analysis may be performed. In this regression analysis, transitions in the other sub-circuits may be used as variables when calculating the statistical relationship or association with the transition in the victim sub-circuit. These statistical relationships allow the largest (or dominant) aggressor sub-circuits to be determined. For example, the calculated statistical relationship may include the F-value (the mean square of a variable divided by the mean square of the error), the t-ratio, as well as other parametric statistical relationships (such as correlation) and/or nonparametric statistical relationships.

In general, the case where the aggressor sub-circuits reduce the operational frequency of the victim sub-circuit (for example, by increasing the propagation delay of the transition along the victim sub-circuit) is of particular interest for assessing cross-talk. However, the testing technique is also useful where the operational frequency of the victim sub-circuit is improved (for example, by decreasing the propagation delay of transition along the victim sub-circuit).

Note that, in general, the testing technique avoids extracting the complex layout of the design to determine adjacent sub-circuits. Extracting the layout of the sub-circuits is typically a time-consuming process. Consequently, these extractions are often rule-based to reduce the number of possible sub-circuit couplings, which implicitly eliminates certain layout adjacencies. However, because this testing technique can be performed without knowledge of the circuit topology, and is purely driven by the calculated statistical relationships (for example, based on silicon path-delay measurements which can be performed using standard scan testing techniques), none of the layout adjacencies needs to be eliminated.

Therefore, using this testing technique, new dependencies may be found that may not have been considered. Moreover, the testing technique can be automated in a circuit tester, which allows a much larger number of candidate victim sub-circuits to be considered in each analysis.

This automation may allow the aggressor-victim effects to be monitored in the manufacturing facility (such as a fab), to identify relationships and trends as a function of process parameters. These results can be used to influence process controls to improve yields and speed-bin distributions. For the specific case of a series of top-level sub-circuits, a statistically relevant number of state-change difference vectors, with a sufficiently random number of transitions on the sub-circuits of interest, can be generated. While it may be difficult in the general case to generate a sufficiently large enough number of state-change difference vectors to obtain statistically relevant results from the regression analysis, most cases of significant cross-talk impact in modern microprocessors have been observed in physically long interconnects routed at the top-level metal layers, which are logically simple, flop-to-flop paths.

Table 1 provides measured clock frequencies at failure for multiple state-change difference vectors and sub-circuits in an integrated circuit with no depth in the sub-circuits. In table 1, a '1' indicates a rising transition, a '−1' indicates a falling transition, and a '0' indicates no transition. Moreover, in this example, the sub-circuits correspond to 33 bits on a bus which have a statistical relationship. For clarity, results for only a few of these 33 sub-circuits are shown in Table 1. In Table 1, the victim sub-circuit is n22, with a falling transition at the failure frequency for each of the state-change difference vectors.

TABLE 1

| State-Change Difference Pattern | Failure Frequency (MHz) | n0 | n7 | n17 | n21 | n22 | n27 | n29 | n31 | n32 |
|---|---|---|---|---|---|---|---|---|---|---|
| 175 | 1492 | 0 | 0 | 1 | 1 | −1 | 1 | 1 | 1 | 0 |
| 179 | 1495 | 0 | 0 | 0 | 1 | −1 | 1 | 1 | 0 | 0 |
| 209 | 1495 | 1 | 1 | 0 | 1 | −1 | 1 | 0 | 0 | 0 |
| 291 | 1495 | 0 | 1 | 0 | 1 | −1 | 1 | 0 | −1 | 0 |
| 122 | 1498 | −1 | 1 | 1 | 1 | −1 | 1 | 1 | −1 | 0 |
| 170 | 1498 | 1 | 0 | −1 | 1 | −1 | 1 | 1 | 0 | 0 |
| 234 | 1498 | 1 | −1 | −1 | 1 | −1 | 0 | 1 | 1 | 0 |
| 264 | 1498 | −1 | 0 | 1 | 1 | −1 | 0 | 1 | 1 | 0 |
| 286 | 1498 | −1 | 0 | 1 | 1 | −1 | 1 | 1 | 0 | 0 |
| 147 | 1503 | −1 | 0 | 0 | 1 | −1 | 1 | 0 | −1 | 1 |
| 197 | 1503 | −1 | 1 | 0 | 1 | −1 | 1 | 1 | 1 | 1 |
| 40 | 1503 | 1 | −1 | 0 | 1 | −1 | 1 | 1 | 1 | 0 |
| 68 | 1503 | 0 | 1 | −1 | 1 | −1 | 0 | 0 | 0 | 1 |
| 153 | 1506 | 0 | −1 | 1 | 1 | −1 | 0 | 0 | 0 | 0 |
| 220 | 1506 | 1 | 1 | 0 | 0 | −1 | 1 | 1 | 0 | −1 |
| 240 | 1506 | 0 | 0 | 1 | 1 | −1 | 0 | 1 | 1 | 1 |
| 47 | 1506 | 0 | 1 | −1 | 1 | −1 | 1 | −1 | −1 | 1 |
| 52 | 1506 | 0 | −1 | −1 | 1 | −1 | 0 | 0 | 0 | 0 |
| 296 | 1509 | 1 | 1 | 0 | 0 | −1 | 1 | 0 | 0 | 0 |

Based on the t-values between the other sub-circuits and the victim sub-circuit (which includes association and anti-association), the dominant aggressor sub-circuits are n21, n27, n32 and n29 (for example, note the large number of rising transitions for multiple state-change difference vectors for n21). This is shown in Table 2, which provides regression analysis results based on the measurements in Table 1. Note that as the t-ratio decreases it eventually falls below or near to a noise floor, where cross-talk may weakly help improve performance (such as for sub-circuits n9 and n7). Also note that after the first four sub-circuits (i.e., n21, n27, n32 and n29), it is likely that the statistical relationships (i.e., the t-ratios) between the victim sub-circuit and the aggressor sub-circuits are due to random noise.

TABLE 2

| Sub-Circuit | Estimate | Standard Error | t-Ratio | Probability > \|t-Ratio\| |
|---|---|---|---|---|
| n21 | −9.257515 | 0.839632 | −11.03 | <0.0001 |
| n27 | −7.773955 | 0.972710 | −7.99 | <0.0001 |
| n32 | −3.775235 | 0.907537 | −4.16 | 0.0001 |
| n29 | −3.327954 | 0.835253 | −3.98 | 0.0002 |
| n20 | −1.619525 | 0.837912 | −1.93 | 0.0585 |
| n8 | −1.538936 | 0.837434 | −1.84 | 0.0716 |
| n6 | −1.347824 | 0.745735 | −1.81 | 0.0763 |
| n31 | −1.476271 | 0.829314 | −1.78 | 0.0807 |
| n16 | −1.514191 | 0.888059 | −1.71 | 0.0939 |
| n4 | −1.686305 | 1.023029 | −1.65 | 0.1051 |
| n11 | −1.283619 | 0.797833 | −1.61 | 0.1135 |
| n9 | 1.4716254 | 0.919112 | 1.60 | 0.1152 |
| n26 | −1.386665 | 1.033783 | −1.34 | 0.1854 |
| n7 | 1.0719896 | 0.887271 | 1.21 | 0.2322 |
| n23 | −0.699445 | 0.829194 | −0.84 | 0.4027 |

Figure 3:
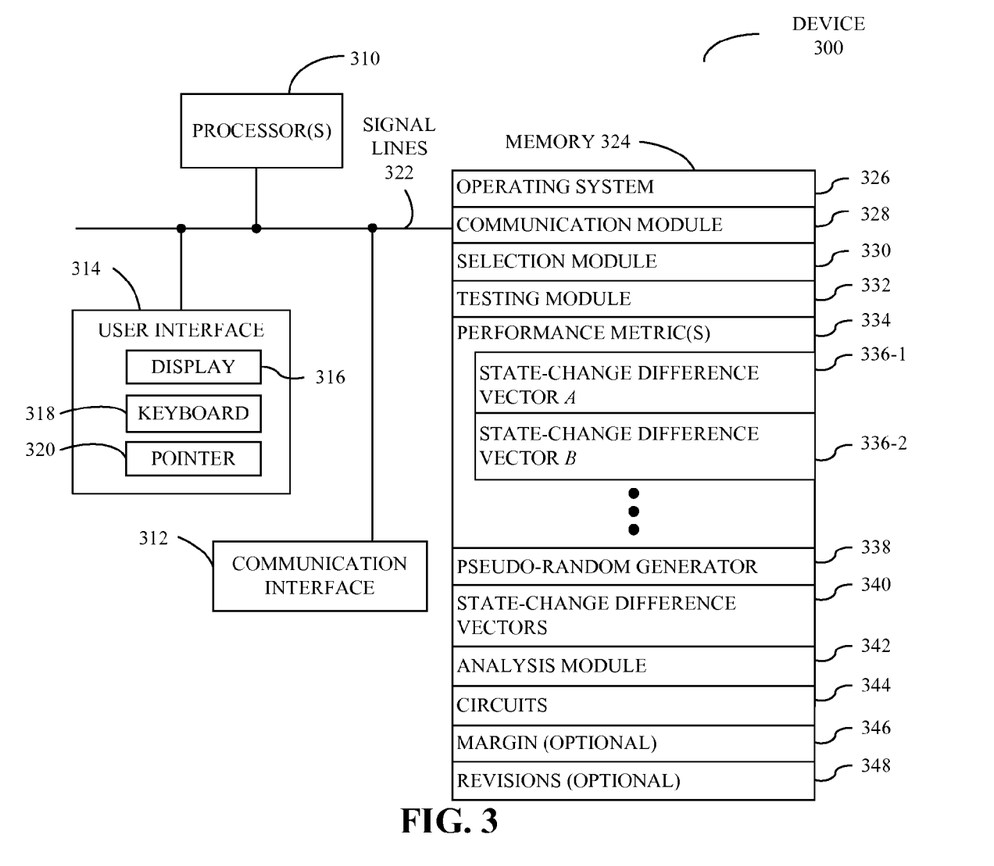
FIG. 3 is a block diagram illustrating a device in accordance with an embodiment of the present invention.

We now describe embodiments of a device that performs process 200 (FIG. 2). FIG. 3 presents a block diagram illustrating a device 300. Device 300 includes: one or more processors (or processor cores) 310, a communication interface 312, a user interface 314, and one or more signal lines 322 coupling these components together. Note that the one or more processors (or processor cores) 310 may support parallel processing and/or multi-threaded operation, the communication interface 312 may have a persistent communication connection, and the one or more signal lines 322 may constitute a communication bus. Moreover, the user interface 314 may include: a display 316, a keyboard 318, and/or a pointer 320, such as a mouse.

Memory 324 in the device 300 may include volatile memory and/or non-volatile memory. More specifically, memory 324 may include: ROM, RAM, EPROM, EEPROM, flash, one or more smart cards, one or more magnetic disc storage devices, and/or one or more optical storage devices. Memory 324 may store an operating system 326 that includes procedures (or a set of instructions) for handling various basic system services for performing hardware-dependent tasks. Moreover, memory 324 may also store communications procedures (or a set of instructions) in a communication module 328. These communication procedures may be used for communicating with one or more computers, devices and/or servers, including computers, devices and/or servers that are remotely located with respect to the device 300.

Memory 324 may also include one or more program modules (or a set of instructions), including: selection module 330 (or a set of instructions), testing module 332 (or a set of instructions), pseudo-random generator 338 (or a set of instructions), and/or analysis module 342 (or a set of instructions).

During operation, pseudo-random generator 338 may generate a group of state-change difference vectors 340, and selection module 330 may select sub-circuits or nets in one of circuits 344. Then, testing module 332 may perform measurements on the circuit using the group of state-change difference vectors 340 to obtain data for one or more performance metric(s) 334, such as the data for state-change difference vector A 336-1 or state-change difference vector B 336-2.

Next, analysis module 342 may calculate statistical relationships using the data for the one or more performance metric(s) 334 based on the selected sub-circuits to identify the aggressor sub-circuits and a sub-group of the group of state-change difference vectors 340. This information may be used to determine optional margin 346 and/or optional revisions 348 to the circuit (such as changes to the design of the circuit or the manufacturing process). For example, the optional margin 346 may correspond to the slope of a cumulative probability distribution for the one or more performance metric(s) 334 for the group of state-change difference vectors 340.

Instructions in the various modules in the memory 324 may be implemented in: a high-level procedural language, an object-oriented programming language, and/or in an assembly or machine language. The programming language may be compiled or interpreted, i.e., configurable or configured, to be executed by the one or more processors (or processor cores) 310.

Although the device 300 is illustrated as having a number of discrete components, FIG. 3 is intended to be a functional description of the various features that may be present in the device 300 rather than a structural schematic of the embodiments described herein. In practice, and as recognized by those of ordinary skill in the art, the functions of the device 300 may be distributed over a large number of servers or computers, with various groups of the servers or computers performing particular subsets of the functions. These servers or computers may be at one location or may be distributed over multiple, geographically dispersed locations. Consequently, instructions associated with the circuit testing may be received and communicated within the computer system over a network, such as: the Internet or World Wide Web (WWW), an intranet, a local area network (LAN) (such as IEEE 802.11 or WiFi), a wide area network (WAN) (such as IEEE 802.16 or WiMAX), a metropolitan area network (MAN), a satellite network, a wireless network (such as a cellular telephone network), an optical network, and/or a combination of networks or other technology enabling communication between computing systems or electronic devices. In some embodiments, some or all of the functionality of the device 300 may be implemented in one or more application-specific integrated circuits (ASICs) and/or one or more digital signal processors (DSPs).

Device 300 may include fewer components or additional components. Moreover, two or more components may be combined into a single component and/or a position of one or more components may be changed. In some embodiments the functionality of device 300 may be implemented more in hardware and less in software, or less in hardware and more in software, as is known in the art.

Figure 4:
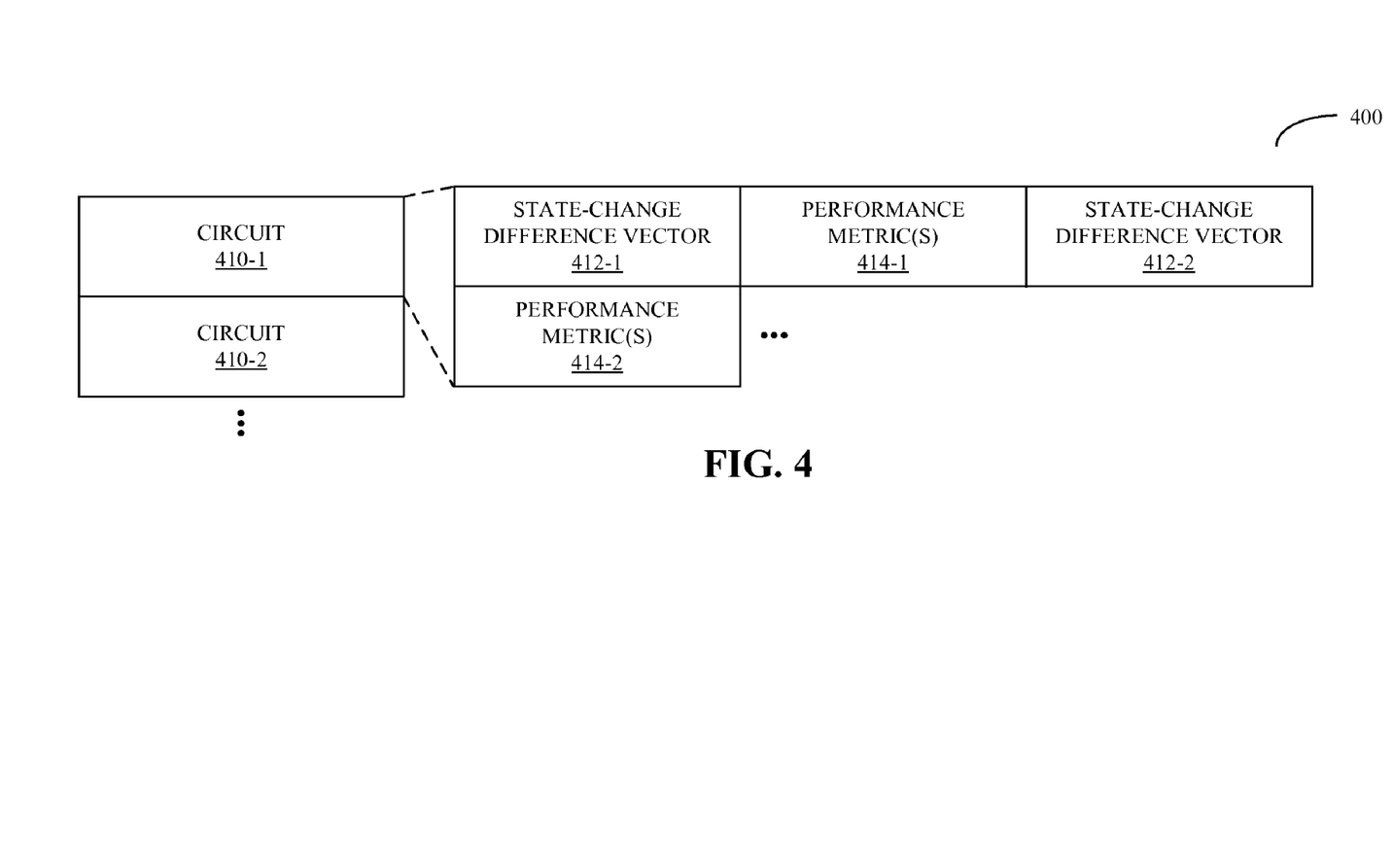
FIG. 4 is a block diagram illustrating a data structure in accordance with an embodiment of the present invention.

We now discuss data structures that may be used in the device 300. FIG. 4 presents a block diagram illustrating a data structure 400. This data structure may include data for circuits 410. More specifically, for a given circuit, such as circuit 410-1, the data may include multiple pairs of state-change difference vectors 412 and one or more corresponding performance metrics 414 (which may be measured or calculated for a given state-change difference vector).

In some embodiments of data structure 400, there are fewer or additional components. Moreover, two or more components may be combined into a single component and/or a position of one or more components may be changed.

While the preceding discussion used cross-talk as an illustration, in other embodiments the testing technique may be used with a variety of performance metrics, such as power consumption of the integrated circuit.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for selecting a sub-group of state-change difference vectors from a group of state-change difference vectors for testing a circuit, comprising:
   using a computer to generate the group state-change difference vectors, wherein a given state-change difference vector corresponds to a change in a state of circuit components in the circuit, and wherein one or more elements in the given state-change difference vector specify state transitions for one or more of the circuit components;
   determining values of a performance metric for the group of state-change difference vectors when the circuit fails during testing, wherein a given value of the performance metric corresponds to the given state-change difference vector;
   for a given sub-circuit in a set of sub-circuits in the circuit and the group of state-change difference vectors, calculating statistical relationships between a transition type in the given sub-circuit when the circuit failed during testing and transition types in other sub-circuits in the set of sub-circuits, wherein a statistical relationship is determined for each pairing of the given sub-circuit with one of the other sub-circuits;
   repeating the calculating for all of the sub-circuits in the set of sub-circuits; and
   selecting the sub-group of state-change difference vectors based on the calculated statistical relationships, wherein the selected state-change difference vectors are those that result in failure of the circuit during testing for a range of values of the performance metric.

2. The method of claim 1, wherein the group of state-change difference vectors is generated using a pseudo-random generator.

3. The method of claim 1, wherein a number of state-change difference vectors in the group of state-change difference vectors is based on a number of logic levels and fan-in between gates in the circuit.

4. The method of claim 1, wherein the circuit components include logic circuits.

5. The method of claim 1, wherein the circuit components include gates.

6. The method of claim 1, wherein the performance metric includes clock speed.

7. The method of claim 1, wherein the performance metric includes power consumption.

8. The method of claim 1, wherein determining the values of the performance metric involves measurements on a current version of the circuit.

9. The method of claim 1, wherein the transition types in the other sub-circuits include a transition from a first logical state to a second logical state, a transition from the second logical state to the first logical state, and no transition.

10. The method of claim 1, wherein the transition types in the other sub-circuits can include the transition type in the given sub-circuit.

11. The method of claim 1, further comprising selecting the set of sub-circuits in the circuit prior to calculating the statistical relationships.

12. The method of claim 1, wherein the statistical relationship for each pairing corresponds to co-occurrences of the transition type in the given sub-circuit and one of the transition types in the one of the other sub-circuits for multiple state-change difference vectors in the group of state-change difference vectors.

13. The method of claim 12, wherein a co-occurrence for a given state-change difference vector includes a presence of the transition type in the given sub-circuit and a presence of the one of the transition types in the one of the other sub-circuits, or an absence of the transition type in the given sub-circuit and an absence of the one of the transition types in the one of the other sub-circuits.

14. The method of claim 1, wherein the statistical relationship for each pairing corresponds to cross-occurrences of the transition type in the given sub-circuit and one of the transition types in the one of the other sub-circuits for multiple state-change difference vectors in the group of state-change difference vectors.

15. The method of claim 14, wherein a cross-occurrence for a given state-change difference vector includes a presence of the transition type in the given sub-circuit and an absence of the one of the transition types in the one of the other sub-circuits, or an absence of the transition type in the given sub-circuit and a presence of the one of the transition types in the one of the other sub-circuits.

16. The method of claim 1, further comprising determining a margin for the performance metric using the selected sub-group of state-change difference vectors.

17. The method of claim 16, further comprising revising the circuit based on the determined margin or changing manufacturing of the circuit based on the determined margin.

18. The method of claim 1, wherein failure of the circuit for the given state-change difference vector is associated with cross-talk.

19. A computer-program product for use in conjunction with a computer system, the computer-program product comprising a non-transitory computer-readable storage medium and a computer-program mechanism embedded therein for selecting a sub-group of state-change difference vectors from a group of state-change difference vectors for testing a circuit, the computer-program mechanism including:
  instructions for generating the group state-change difference vectors, wherein a given state-change difference vector corresponds to a change in a state of circuit components in the circuit, and wherein one or more elements in the given state-change difference vector specify state transitions for one or more of the circuit components;
  instructions for determining values of a performance metric for the group of state-change difference vectors when the circuit fails during testing, wherein a given value of the performance metric corresponds to the given state-change difference vector;
  for a given sub-circuit in a set of sub-circuits in the circuit and the group of state-change difference vectors, instructions for calculating statistical relationships between a transition type in the given sub-circuit when the circuit failed during testing and transition types in other sub-circuits in the set of sub-circuits, wherein a statistical relationship is determined for each pairing of the given sub-circuit with one of the other sub-circuits;
  instructions for repeating the calculating for all of the sub-circuits in the set of sub-circuits; and
  instructions for selecting the sub-group of state-change difference vectors based on the calculated statistical relationships, wherein the selected state-change difference vectors are those that result in failure of the circuit during testing for a range of values of the performance metric.

20. A computer system, comprising:
  a processor;
  memory;
    a program module, wherein the program module is stored in the memory and configured to be executed by the processor, wherein the program module selects a sub-group of state-change difference vectors from a group of state-change difference vectors for testing a circuit, the program module including:
  instructions for generating the group state-change difference vectors, wherein a given state-change difference vector corresponds to a change in a state of circuit components in the circuit, and wherein one or more elements in the given state-change difference vector specify state transitions for one or more of the circuit components;
  instructions for determining values of a performance metric for the group of state-change difference vectors when the circuit fails during testing, wherein a given value of the performance metric corresponds to the given state-change difference vector;
  for a given sub-circuit in a set of sub-circuits in the circuit and the group of state-change difference vectors, instructions for calculating statistical relationships between a transition type in the given sub-circuit when the circuit failed during testing and transition types in other sub-circuits in the set of sub-circuits, wherein a statistical relationship is determined for each pairing of the given sub-circuit with one of the other sub-circuits;
  instructions for repeating the calculating for all of the sub-circuits in the set of sub-circuits; and
  instructions for selecting the sub-group of state-change difference vectors based on the calculated statistical relationships, wherein the selected state-change difference vectors are those that result in failure of the circuit during testing for a range of values of the performance metric.

* * * * *